(12) United States Patent
Choi et al.

(10) Patent No.: US 11,508,820 B2
(45) Date of Patent: Nov. 22, 2022

(54) SINGLE CRYSTAL SEMICONDUCTOR STRUCTURE AND METHOD OF FABRICATING THE SAME

(71) Applicants: SAMSUNG ELECTRONICS CO., LTD., Suwon-si (KR); iBeam Materials, Inc., Santa Fe, NM (US)

(72) Inventors: Junhee Choi, Seongnam-si (KR); Joohun Han, Hwaseong-si (KR); Vladimir Matias, Santa Fe, NM (US)

(73) Assignees: SAMSUNG ELECTRONICS CO., LTD., Suwon-si (KR); iBeam Materials, Inc., Santa Fe, NM (US)

( * ) Notice: Subject to any disclaimer, the term of this patent is extended or adjusted under 35 U.S.C. 154(b) by 0 days.

(21) Appl. No.: 17/100,340

(22) Filed: Nov. 20, 2020

(65) Prior Publication Data

US 2021/0159314 A1    May 27, 2021

Related U.S. Application Data

(60) Provisional application No. 62/939,086, filed on Nov. 22, 2019.

(30) Foreign Application Priority Data

Mar. 3, 2020 (KR) .................. 10-2020-0026814

(51) Int. Cl.
*H01L 21/00* (2006.01)
*H01L 29/16* (2006.01)
(Continued)

(52) U.S. Cl.
CPC ...... *H01L 29/1604* (2013.01); *H01L 21/0254* (2013.01); *H01L 21/0259* (2013.01);
(Continued)

(58) Field of Classification Search
CPC ......... H01L 21/02436; H01L 21/02488; H01L 21/0254; H01L 21/02546
See application file for complete search history.

(56) References Cited

U.S. PATENT DOCUMENTS 6,638,838 B1 * 10/2003 Eisenbeiser ....... H01L 21/02381
117/101
10,087,547 B2 10/2018 Chen et al.
(Continued)

FOREIGN PATENT DOCUMENTS

JP         3779831 B2    5/2006
JP      2013040058 A    2/2013
(Continued)

OTHER PUBLICATIONS

Smirnov, Sergey. Physical Modeling of Electron Transport in Strained Silicon and Silicon-Germanium. 2013. Vienna University of Technology, pp. 42-45. PhD dissertation. (Year: 2003).*
(Continued)

*Primary Examiner* — Reema Patel
(74) *Attorney, Agent, or Firm* — Sughrue Mion, PLLC

(57) ABSTRACT

A single crystal semiconductor structure includes: an amorphous substrate; a single crystal semiconductor layer provided on the amorphous substrate; and a thin orienting film provided between the amorphous substrate and the single crystal semiconductor layer, wherein the thin orienting film is a single crystal thin film, and the thin orienting film has a non-zero thickness that is equal to or less than 10 times a critical thickness $h_c$.

13 Claims, 10 Drawing Sheets

(51) Int. Cl.
  *H01L 29/04* (2006.01)
  *H01L 21/02* (2006.01)
(52) U.S. Cl.
  CPC .. *H01L 21/02428* (2013.01); *H01L 21/02488* (2013.01); *H01L 21/02546* (2013.01); *H01L 21/02617* (2013.01); *H01L 29/04* (2013.01)

(56) References Cited

U.S. PATENT DOCUMENTS

| | | | |
|---|---|---|---|
| 10,546,976 B2 | 1/2020 | Matias et al. | |
| 2003/0057491 A1* | 3/2003 | Mitani | H01L 21/2022 257/347 |
| 2009/0269875 A1* | 10/2009 | Kato | H01L 31/072 438/58 |
| 2016/0233383 A1 | 8/2016 | Matias et al. | |
| 2018/0351040 A1 | 12/2018 | Matias | |

FOREIGN PATENT DOCUMENTS

| | | | | |
|---|---|---|---|---|
| KR | 20130026671 | * | 3/2013 | .......... H01L 21/324 |
| WO | 2016130725 A1 | | 8/2016 | |

OTHER PUBLICATIONS

Choi, J. H., et al., "Nearly single-crystalline GaN light-emitting diodes on amorphous glass substrates", Nature Photonics, vol. 5, Dec. 2011, pp. 763-769.

Dai, Y., et al., "Engineering of the Curie temperature of epitaxial $Sr_{1-x}Ba_xTiO_3$ films via strain", Journal of Applied Physics, vol. 120, 2016, pp. 114101-1 to 114101-6 (7 pages).

\* cited by examiner

SINGLE CRYSTAL SEMICONDUCTOR STRUCTURE AND METHOD OF FABRICATING THE SAME

CROSS-REFERENCE TO RELATED APPLICATIONS

This application claims the benefit of U.S. Patent Provisional Application No. 62/939,086, filed on Nov. 22, 2019, in the United States Patent and Trademark Office, and priority to Korean Patent Application No. 10-2020-0026814, filed on Mar. 3, 2020, in the Korean Intellectual Property Office, the disclosures of which are incorporated by reference herein in their entireties.

BACKGROUND

1. Field

Example embodiments of the present disclosure relates to single crystal semiconductor structures and methods of fabricating the single crystal semiconductor structures.

2. Description of Related Art

A single crystal substrate is used for epitaxy growth of a single crystal Group III-V compound semiconductor layer. For example, a c-plane sapphire substrate or a single crystal silicon substrate having the (111) direction is used for the growth of a single crystal GaN layer. Because the size of single crystal substrates is limited, the size of epitaxially-grown single crystal Group III-V compound semiconductor layers is also limited. In addition, because single crystal substrates are expensive, epitaxy growth processes for forming single crystal Group III-V compound semiconductor layers are costly. Thus, epitaxy growth processes using substrates other than single crystal substrates are required to reduce the costs of epitaxy growth processes for forming single crystal Group III-V compound semiconductor layers and to freely determine the size of single crystal Group III-V compound semiconductor layers.

SUMMARY

Provided are single crystal semiconductor structures including a single crystal semiconductor layer formed on an amorphous substrate.

Also provided are methods of forming a single crystal semiconductor layer on an amorphous substrate.

However, the present disclosure is not limited thereto.

Additional aspects will be set forth in part in the description which follows and, in part, will be apparent from the description, or may be learned by practice of the presented embodiments of the disclosure.

In accordance with an aspect of the disclosure, a single crystal semiconductor structure includes an amorphous substrate; a single crystal semiconductor layer provided on the amorphous substrate; and a thin orienting film provided between the amorphous substrate and the single crystal semiconductor layer, wherein the thin orienting film includes a single crystal thin film, wherein the thin orienting film has a non-zero thickness equal to or less than 10 times a critical thickness $h_c$, and wherein the critical thickness $h_c$ is determined by the following equation:

$$h_c = \left[\frac{b}{4\pi(1+\mu)\epsilon_0}\right]\left[\ln\left(\frac{h_c}{b}\right)+1\right]$$

where b is a Burgers vector of dislocation of the thin orienting film, $\mu$ is Poisson's ratio of the thin orienting film, and $\epsilon_0$ is a degree of lattice misfit between the thin orienting film and the single crystal semiconductor layer.

The single crystal semiconductor layer may include a lower single crystal layer; and an upper single crystal layer, wherein the lower single crystal layer includes a nucleation layer for the upper single crystal layer.

A crystallinity of the upper single crystal layer may be higher than a crystallinity of the lower single crystal layer.

The single crystal semiconductor structure may further include a mask pattern provided between the lower single crystal layer and the upper single crystal layer, the mask pattern may include holes through which the lower single crystal layer is exposed to the upper single crystal layer, and the upper single crystal layer may be provided on the mask pattern and fill the holes.

The thin orienting film may include a lattice structure that matches a lattice structure of the lower single crystal layer.

The single crystal thin film may have a (001) direction or a (111) direction, and the single crystal semiconductor layer may have the (001) direction or the (111) direction.

The thin orienting film may include a thin $CeO_2$ film having the (111) direction or a thin $Sc_2O_3$ film having the (111) direction, and the single crystal semiconductor layer may be a GaN layer having the (001) direction.

The thin orienting film may have a (100) direction, and the single crystal semiconductor layer may have the (100) direction.

The thin orienting film may include a thin MgO film having the (100) direction, and the single crystal semiconductor layer may include a GaAs layer having the (100) direction.

The single crystal semiconductor structure may further include an upper heat transfer layer provided between the thin orienting film and the amorphous substrate.

The upper heat transfer layer may include a metal.

The single crystal semiconductor structure may further include a planarization layer provided between the upper heat transfer layer and the thin orienting film, wherein the planarization layer includes a top surface facing the thin orienting film and a bottom surface facing the upper heat transfer layer, and wherein a surface roughness of the top surface of the planarization layer is less than a surface roughness of the bottom surface of the planarization layer.

The planarization layer may include a silicon oxide or a silicon nitride.

The single crystal semiconductor structure may further include a lower heat transfer layer provided on a side of the amorphous substrate opposite the thin orienting film.

The lower heat transfer layer may include a metal.

In accordance with an aspect of the disclosure, a method of fabricating a single crystal semiconductor structure includes forming a thin orienting film on an amorphous substrate; forming a lower single crystal layer on the thin orienting film; and forming an upper single crystal layer on the lower single crystal layer, wherein the thin orienting film has a non-zero thickness equal to or less than 10 times a critical thickness $h_c$, and wherein the critical thickness $h_c$ is determined by the following equation:

$$h_c = \left[\frac{b}{4\pi(1+\mu)\epsilon_0}\right]\left[\ln\left(\frac{h_c}{b}\right)+1\right]$$

where b is a Burgers vector of dislocation of the thin orienting film, μ is Poisson's ratio of the thin orienting film, and $\varepsilon_0$ is a degree of lattice misfit between the thin orienting film and the lower single crystal layer.

The forming of the thin orienting film may include an ion beam assisted deposition (IBAD) process.

The forming of the lower single crystal layer may include a first epitaxy growth process, the forming of the upper single crystal layer may include a second epitaxy growth process, and the first epitaxy growth process may be performed at a temperature lower than a temperature at which the second epitaxy growth process is performed.

The method may further include heat treating the lower single crystal layer after the first epitaxy growth process.

The first epitaxy growth process may be performed at a temperature of about 800 degrees (° C.) or lower, and the second epitaxy growth process may be performed at a temperature of about 900 degrees (° C.) or higher.

The method may further include forming a lower heat transfer layer on a bottom surface of the amorphous substrate by depositing a metal on the bottom surface of the amorphous substrate.

The method may further include forming an upper heat transfer layer between the amorphous substrate and the thin orienting film by depositing a metal on a top surface of the amorphous substrate.

The method may further include forming a planarization layer between the thin orienting film and the upper heat transfer layer by depositing a silicon nitride or a silicon oxide on a top surface of the upper heat transfer layer.

The method may further include forming a mask pattern between the lower single crystal layer and the upper single crystal layer, wherein the mask pattern includes holes through which the lower single crystal layer is exposed to the upper single crystal layer, and the upper single crystal layer is formed to fill the holes and cover a top surface of the mask pattern.

The mask pattern may be formed through an in-situ process and may include SiN.

The mask pattern may be formed through an ex-situ process and may include $SiO_2$ or SiN.

In accordance with an aspect of the disclosure, a method of fabricating a single crystal semiconductor structure includes forming a thin orienting film on an amorphous substrate; forming a defect on a top surface of the thin orienting film; and forming a single crystal semiconductor layer on the thin orienting film, wherein the thin orienting film has a non-zero thickness equal to or less than 10 times a critical thickness $h_c$, and wherein the critical thickness $h_c$ is determined by the following equation:

$$h_c = \left[\frac{b}{4\pi(1+\mu)\varepsilon_0}\right]\left[\ln\left(\frac{h_c}{b}\right)+1\right]$$

where b is a Burgers vector of dislocation of the thin orienting film, μ is Poisson's ratio of the thin orienting film, and $\varepsilon_0$ is a degree of lattice misfit between the thin orienting film and the single crystal semiconductor layer.

The forming of the defect on the top surface of the thin orienting film may include performing a plasma surface treatment on the top surface of the thin orienting film.

The forming of the single crystal semiconductor layer may include an epitaxy growth process.

The epitaxy growth process may be performed at a temperature of 900 degrees (° C.) or higher.

In accordance with an aspect of the disclosure, a single crystal semiconductor structure includes an amorphous substrate; a single crystal film formed directly on the amorphous substrate; and a single crystal semiconductor layer formed directly on the single crystal film, wherein a lattice constant of the single crystal film is different from a lattice constant of the single crystal semiconductor layer.

A thickness of the single crystal film may be about 50 nm or less.

BRIEF DESCRIPTION OF THE DRAWINGS

The above and other aspects, features, and advantages of certain example embodiments of the disclosure will be more apparent from the following description taken in conjunction with the accompanying drawings, in which.

DETAILED DESCRIPTION

Figure 1:
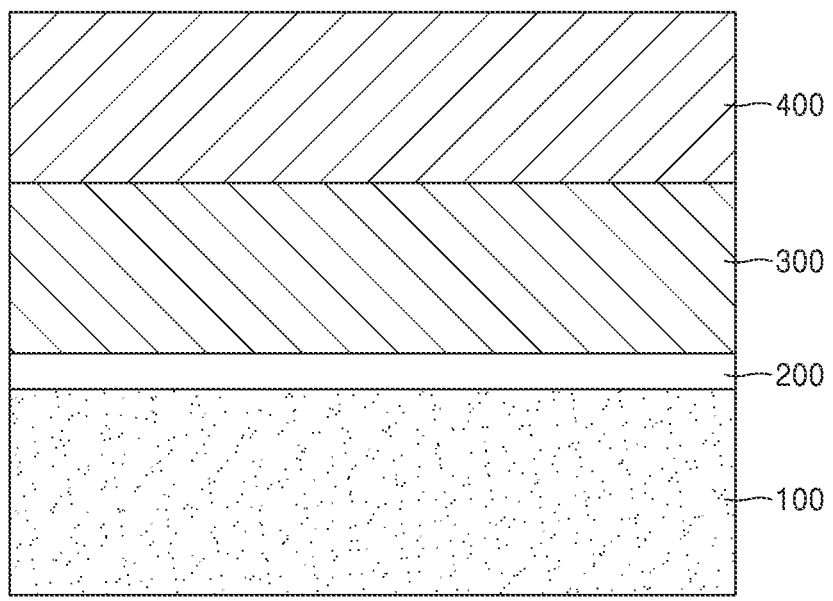
FIG. 1 is a cross-sectional view illustrating a single crystal semiconductor structure according to example embodiments.

Reference will now be made in detail to embodiments, examples of which are illustrated in the accompanying drawings. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Hereinafter, embodiments will be described with reference to the accompanying drawings. In the drawings, like reference numerals refer to like elements, and the sizes of elements may be exaggerated for clarity of illustration. The embodiments described herein are for illustrative purposes only, and various modifications may be made therein.

In the following description, when an element is referred to as being "above" or "on" another element, it may be directly on the other element while making contact with the other element or may be above the other element without making contact with the other element.

The terms of a singular form may include plural forms unless otherwise mentioned. It will be further understood that the terms "comprises", "comprising", "includes", and/or "including" used herein specify the presence of stated features or elements, but do not preclude the presence or addition of one or more other features or elements.

In the present disclosure, terms such as "unit" or "~or/er" are used to denote a unit having at least one function or operation and may be implemented with hardware, software, or a combination of hardware and software.

FIG. 1 is a cross-sectional view illustrating a single crystal semiconductor structure 10 according to example embodiments.

Referring to FIG. 1, the single crystal semiconductor structure 10 may be provided as follows. The single crystal semiconductor structure 10 may include a substrate 100, a thin orienting film 200, a lower single crystal layer 300, and an upper single crystal layer 400. The substrate 100 may be an amorphous substrate. For example, the substrate 100 may include glass or a metal layer coated with an amorphous layer.

The thin orienting film 200 may be provided on the substrate 100. The thin orienting film 200 may be a single crystal thin film. For example, the thin orienting film 200 may have the (111) direction, the (001) direction, or the (100) direction. When the thin orienting film 200 has the (111) direction, the thin orienting film 200 may be a thin $CeO_2$ film or a thin $Sc_2O_3$ film. When the thin orienting film 200 has the (100) direction, the thin orienting film 200 may be a thin MgO film.

The thickness of the thin orienting film 200 is sufficiently small, and thus, the lower single crystal layer 300 may be thermodynamically and stably provided on the thin orienting film 200. For example, the thickness of the thin orienting film 200 may be equal to or less than 10 times a critical thickness $h_c$. The critical thickness $h_c$ may be expressed by the following equation:

$$h_c = \left[\frac{b}{4\pi(1+\mu)\epsilon_0)}\right]\left[\ln\left(\frac{h_c}{b}\right)+1\right],$$

where b is Burgers vector of dislocation of the thin orienting film 200, μ is Poisson's ratio of the thin orienting film 200, and $\epsilon_0$ is a degree of lattice misfit between the thin orienting film 200 and the lower single crystal layer 300.

The lower single crystal layer 300 may be provided on the thin orienting film 200. The lower single crystal layer 300 may be directly in contact with the thin orienting film 200. In other words, a bottom surface of the lower single crystal layer 300 may be directly in contact with a top surface of the thin orienting film 200. The lower single crystal layer 300 may be a Group III-V compound semiconductor layer. For example, when the thin orienting film 200 is a thin $CeO_2$ film having the (111) direction or a thin $Sc_2O_3$ film having the (111) direction, the lower single crystal layer 300 may be a single crystal GaN layer having the (001) direction or a single crystal InGaN layer having the (001) direction. For example, when the thin orienting film 200 is a thin MgO film having the (100) direction, the lower single crystal layer 300 may be a GaAs layer having the (100) direction, an AlGaAs layer having the (100) direction, or an AlGaInP layer having the (100) direction. The lower single crystal layer 300 may be a nucleation layer. The lower single crystal layer 300 may be an epitaxy layer formed at a relatively low temperature. The process of forming the lower single crystal layer 300 will be described later.

The upper single crystal layer 400 may be provided on the lower single crystal layer 300. The upper single crystal layer 400 may have substantially the same material and the same lattice structure as the lower single crystal layer 300. For example, when the lower single crystal layer 300 is a single crystal GaN layer having the (001) direction, the upper single crystal layer 400 may be a single crystal GaN layer having the (001) direction. For example, when the lower single crystal layer 300 is a single crystal GaN layer having the (001) direction, a single crystal InGaN layer having the (001) direction, a GaAs layer having the (100) direction, an AlGaAs layer having the (100) direction, or an AlGaInP layer having the (100) direction, the upper single crystal layer 400 may also be a single crystal GaN layer having the (001) direction, a single crystal InGaN layer having the (001) direction, a GaAs layer having the (100) direction, an AlGaAs layer having the (100) direction, or an AlGaInP layer having the (100) direction, respectively. The upper single crystal layer 400 may be an epitaxy layer formed at a relatively high temperature. The process of forming the upper single crystal layer 400 will be described later.

When the lower single crystal layer 300 is not stably provided on the thin orienting film 200, strain engineering films may be required to reduce strain caused by a lattice constant difference between the thin orienting film 200 and the lower single crystal layer 300.

According to example embodiments, the thin orienting film 200 may have a sufficiently small thickness such that the lower single crystal layer 300 may be stably provided on the thin orienting film 200. Therefore, the lower single crystal layer 300 may be provided on the thin orienting film 200 in direct contact with the thin orienting film 200. In other words, films for reducing strain caused by a lattice constant difference may not be required between the thin orienting film 200 and the lower single crystal layer 300.

Figure 2:
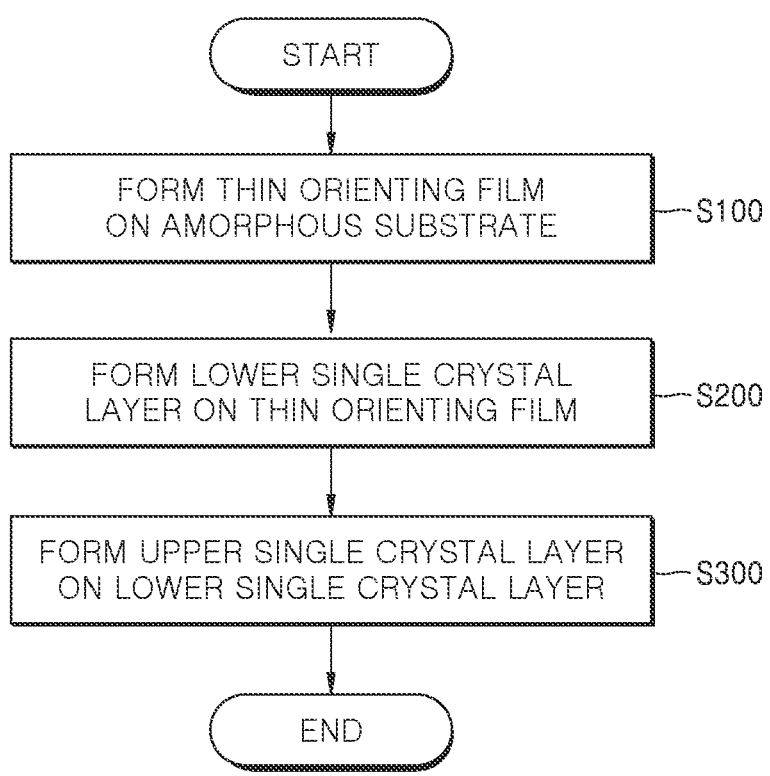
FIG. 2 is a flowchart illustrating a method of fabricating the single crystal semiconductor structure shown in FIG. 1.
Figure 3:
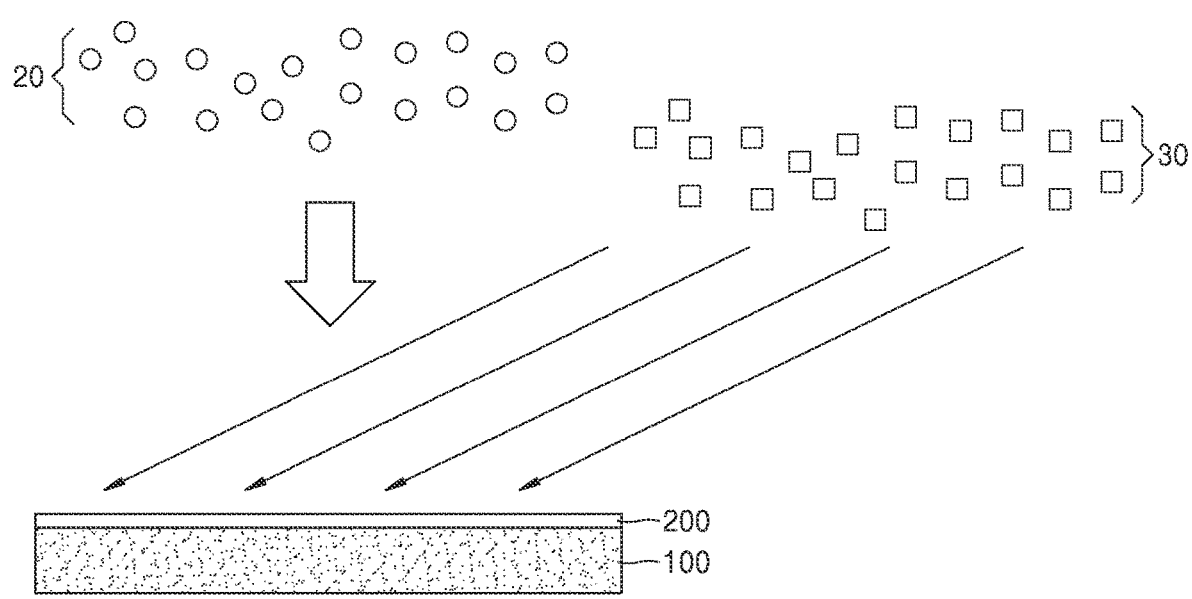
FIG. 3 is a conceptual process view illustrating the single crystal semiconductor structure fabricating method shown in FIG. 1.
Figure 4:
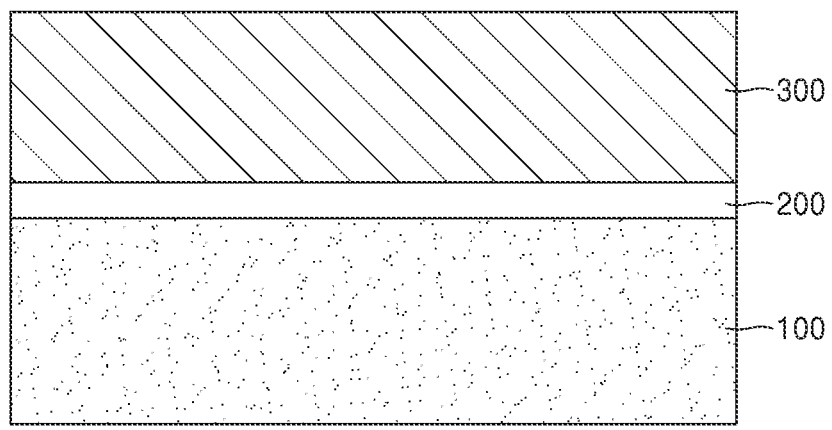
FIG. 4 is a cross-sectional view illustrating the single crystal semiconductor structure fabricating method shown in FIG. 1.

FIG. 2 is a flowchart illustrating a method of fabricating the single crystal semiconductor structure 10 shown in FIG. 1. FIG. 3 is a conceptual process view illustrating the method of fabricating the single crystal semiconductor structure 10 shown in FIG. 1. FIG. 4 is a cross-sectional view illustrating the method of fabricating the single crystal semiconductor structure 10 shown in FIG. 1. For clarity of illustration, substantially the same structures as those described with reference to FIG. 1 may not be described here.

Referring to FIGS. 2 and 3, a thin orienting film 200 may be formed on a substrate 100 (S100). The substrate 100 may include an amorphous substrate. For example, the substrate 100 may include glass or a metal layer coated with an amorphous layer.

The forming of the thin orienting film 200 may include depositing a material 20, which forms the thin orienting film 200, on the substrate 100 as shown, for example, in FIG. 3. During the deposition process of the thin orienting film 200, an inert element 30 may be ejected onto the thin orienting film 200. For example, the thin orienting film 200 may be formed through an ion beam assisted deposition (IBAD) process.

The thin orienting film 200 may be formed as a single crystal thin film. For example, the thin orienting film 200 may be formed to have the (111) direction, the (001)

direction, or the (100) direction. For example, the thin orienting film 200 may be a thin $CeO_2$ film having the (111) direction, a thin $Sc_2O_3$ film having the (111) direction, or a thin MgO film having the (100) direction. The thin orienting film 200 may be formed such that the thickness of the thin orienting film 200 may be equal to or less than 10 times a critical thickness $h_c$. The critical thickness $h_c$ is the same as that described with reference to FIG. 1. For example, the thin orienting film 200 may have a thickness of about 50 nanometers (nm) or less.

Referring to FIGS. 2 and 4, a lower single crystal layer 300 may be formed on the thin orienting film 200 (S200). For example, the lower single crystal layer 300 may be formed through a first epitaxy growth process. The lower single crystal layer 300 may be formed at a relatively low temperature. For example, the first epitaxy growth process may be performed at a temperature of about 800 degrees (° C.) or less. For example, the first epitaxy growth process may be performed at a temperature of about 530 degrees (° C.). The lower single crystal layer 300 may be a nucleation layer. The lower single crystal layer 300 may be formed to have a lattice structure matching the lattice structure of the thin orienting film 200. For example, when the thin orienting film 200 is a thin $CeO_2$ film having the (111) direction or a thin $Sc_2O_3$ film having the (111) direction, the lower single crystal layer 300 may be a single crystal GaN layer having the (001) direction or a single crystal InGaN layer having the (001) direction. For example, when the thin orienting film 200 is a thin MgO film having the (100) direction, the lower single crystal layer 300 may be a GaAs layer having the (100) direction, an AlGaAs layer having the (100) direction, or an AlGaInP layer having the (100) direction. After the first epitaxy growth process, the lower single crystal layer 300 may be heat treated.

Referring to FIGS. 1 and 2, an upper single crystal layer 400 may be formed on the lower single crystal layer 300 (S300). For example, the upper single crystal layer 400 may be formed through a second epitaxy growth process. The upper single crystal layer 400 may be formed at a relatively high temperature compared to the temperature at which the lower single crystal layer 300 is formed. For example, the second epitaxy growth process may be performed at a temperature of about 900 degrees (° C.) or higher. For example, the second epitaxy growth process may be performed at about 1040 degrees (° C.). The crystallinity of the upper single crystal layer 400 may be higher than that of the lower single crystal layer 300. The upper single crystal layer 400 may have substantially the same material and the same lattice structure as the lower single crystal layer 300. For example, when the lower single crystal layer 300 is a single crystal GaN layer having the (001) direction, a single crystal InGaN layer having the (001) direction, a GaAs layer having the (100) direction, an AlGaAs layer having the (100) direction, or an AlGaInP layer having the (100) direction, the upper single crystal layer 400 may also be a single crystal GaN layer having the (001) direction, a single crystal InGaN layer having the (001) direction, a GaAs layer having the (100) direction, an AlGaAs layer having the (100) direction, or an AlGaInP layer having the (100) direction, respectively.

Example embodiments may provide a method of fabricating a single crystal semiconductor structure by growing the lower single crystal layer 300 directly on the thin orienting film 200. The thin orienting film 200 may have a sufficiently small thickness such that the lower single crystal layer 300 may be stably formed on the thin orienting film 200. Thus, films for reducing strain caused by a lattice constant difference may not be required between the thin orienting film 200 and the lower single crystal layer 300.

Figure 5:
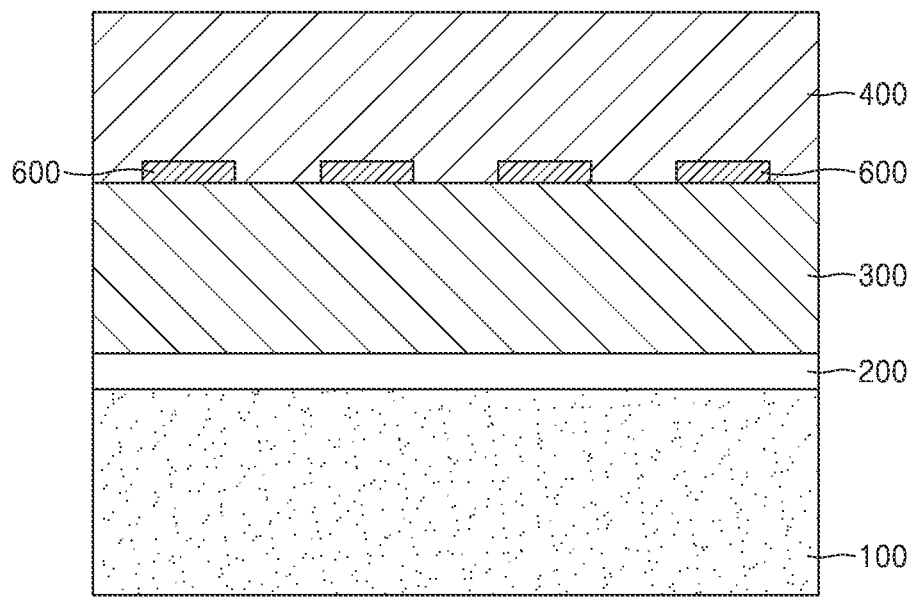
FIG. 5 is a cross-sectional view illustrating a single crystal semiconductor structure according to example embodiments.

FIG. 5 is a cross-sectional view illustrating a single crystal semiconductor structure 11 according to example embodiments. For clarity of illustration, substantially the same structures as those described with reference to FIG. 1 may not be described here.

Referring to FIG. 5, a single crystal semiconductor structure 11 may be provided as follows. The single crystal semiconductor structure 11 may include a substrate 100, a thin orienting film 200, a lower single crystal layer 300, a mask pattern 600, and an upper single crystal layer 400. The substrate 100, the thin orienting film 200, the lower single crystal layer 300, and the upper single crystal layer 400 may be substantially the same as those described with reference to FIG. 1.

The mask pattern 600 may be provided between the lower single crystal layer 300 and the upper single crystal layer 400. The mask pattern 600 may cover a top surface of the lower single crystal layer 300. The mask pattern 600 may include a plurality of holes. The holes of the mask pattern 600 may expose the top surface of the lower single crystal layer 300. The upper single crystal layer 400 may then be epitaxially grown on the exposed top surface of the lower single crystal layer 300. The holes of the mask pattern 600 may be filled with the upper single crystal layer 400.

The mask pattern 600 may be formed through an in-situ process or an ex-situ process. When the mask pattern 600 is formed through an in-situ process, the mask pattern 600 may include a silicon nitride (for example, SiN or $Si_3N_4$). When the mask pattern 600 is formed through an ex-situ process, the mask pattern 600 may include a silicon oxide (for example, $SiO_2$) or a silicon nitride (for example, SiN or $Si_3N_4$).

According to example embodiments, the mask pattern 600 may reduce stress of the lower and upper single crystal layers 300 and 400. Therefore, the crystallinity of the lower and upper single crystal layers 300 and 400 may be improved.

Figure 6:
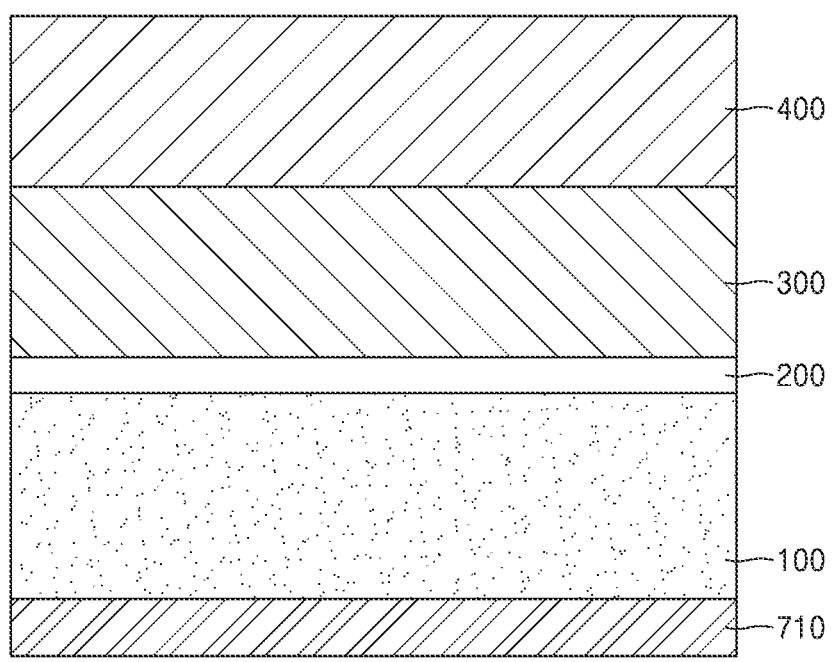
FIG. 6 is a cross-sectional view illustrating a single crystal semiconductor structure according to example embodiments.

FIG. 6 is a cross-sectional view illustrating a single crystal semiconductor structure 12 according to example embodiments. For clarity of illustration, substantially the same structures as those described with reference to FIG. 1 may not be described here.

Referring to FIG. 6, the single crystal semiconductor structure 12 may be provided as follows. The single crystal semiconductor structure 12 may include a substrate 100, a thin orienting film 200, a lower single crystal layer 300, an upper single crystal layer 400, and a lower heat diffusion layer 710. The substrate 100, the thin orienting film 200, the lower single crystal layer 300, and the upper single crystal layer 400 may be substantially the same as those described with reference to FIG. 1.

The lower heat diffusion layer 710 may be provided on a side of the substrate 100 which is opposite the thin orienting film 200 with the substrate 100 positioned therebetween. For example, the lower heat diffusion layer 710 may be provided on a bottom surface of the substrate 100. The lower heat diffusion layer 710 may include a material having good heat transfer characteristics. For example, the lower heat diffusion layer 710 may include a metal layer. For example, the lower heat diffusion layer 710 may include molybdenum (Mo).

The lower heat diffusion layer 710 may be formed through a deposition process. For example, the lower heat diffusion layer 710 may be provided by forming a molybdenum (Mo) film on the bottom surface of the substrate 100 through a sputtering process.

According to example embodiments, the lower heat diffusion layer 710 may maintain the single crystal semiconductor structure 12 at a uniform temperature. Therefore, deterioration of the single crystal semiconductor structure 12 may be reduced or prevented.

Figure 7:
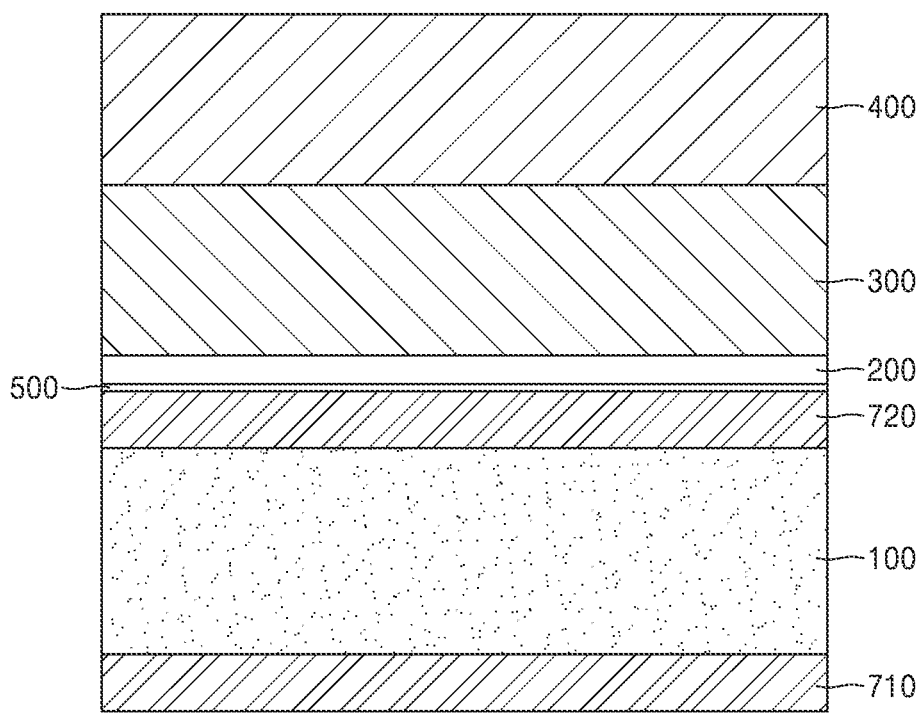
FIG. 7 is a cross-sectional view illustrating a single crystal semiconductor structure according to example embodiments.

FIG. 7 is a cross-sectional view illustrating a single crystal semiconductor structure 13 according to example embodiments. For clarity of illustration, substantially the same structures as those described with reference to FIGS. 1 and 6 may not be described here.

Referring to FIG. 7, the single crystal semiconductor structure 13 may be provided as follows. The single crystal semiconductor structure 13 may include a substrate 100, a thin orienting film 200, a lower single crystal layer 300, an upper single crystal layer 400, a lower heat diffusion layer 710, an upper heat diffusion layer 720, and a planarization layer 500. The substrate 100, the thin orienting film 200, the lower single crystal layer 300, and the upper single crystal layer 400 may be substantially the same as those described with reference to FIG. 1. The lower heat diffusion layer 710 may be substantially the same as that described with reference to FIG. 6.

The upper heat diffusion layer 720 may be provided between the thin orienting film 200 and the substrate 100. For example, the upper heat diffusion layer 720 may be provided on a top surface of the substrate 100. The upper heat diffusion layer 720 may include a material having good heat transfer characteristics. For example, the upper heat diffusion layer 720 may include a metal layer. For example, the upper heat diffusion layer 720 may include molybdenum (Mo).

The upper heat diffusion layer 720 may be formed through a deposition process. For example, the upper heat diffusion layer 720 may be provided by forming a molybdenum (Mo) film on the top surface of the substrate 100 through a sputtering process.

The planarization layer 500 may be provided between the upper heat diffusion layer 720 and the thin orienting film 200. The surface roughness of a top surface of the planarization layer 500 may be less than the surface roughness of a bottom surface of the planarization layer 500. The planarization layer 500 may include a silicon oxide (for example, SiO$_2$) or a silicon nitride (for example, SiN).

According to example embodiments, the upper heat diffusion layer 720 and the lower heat diffusion layer 710 may maintain the single crystal semiconductor structure 13 at a uniform temperature. Therefore, deterioration of the single crystal semiconductor structure 13 may be reduced or prevented.

Figure 8:
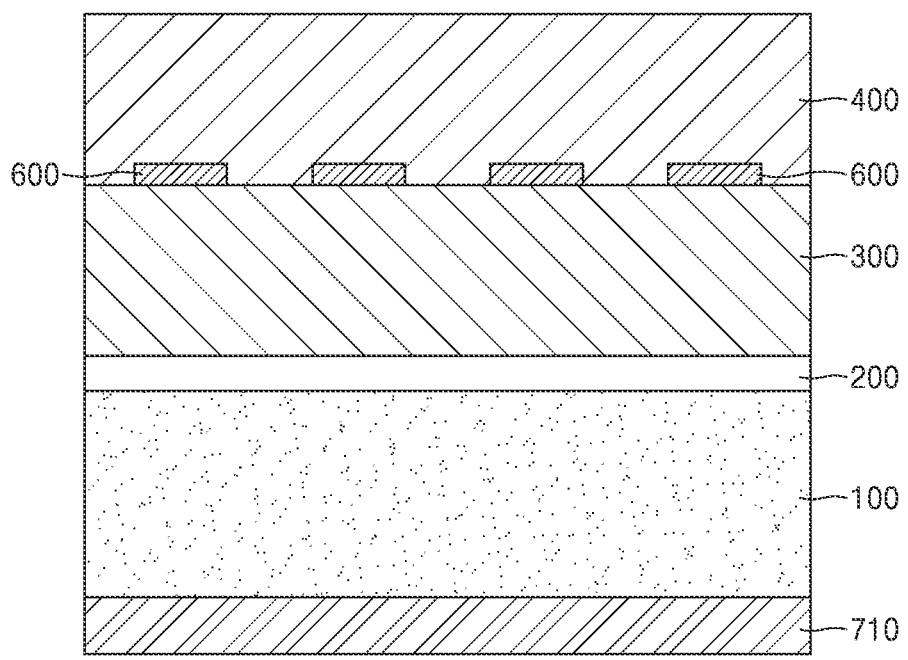
FIG. 8 is a cross-sectional view illustrating a single crystal semiconductor structure according to example embodiments.

FIG. 8 is a cross-sectional view illustrating a single crystal semiconductor structure 14 according to example embodiments. For clarity of illustration, substantially the same structures as those described with reference to FIGS. 1, 5, and 6 may not be described here.

Referring to FIG. 8, the single crystal semiconductor structure 14 may be provided as follows. The single crystal semiconductor structure 14 may include a substrate 100, a thin orienting film 200, a lower single crystal layer 300, a mask pattern 600, an upper single crystal layer 400, and a lower heat diffusion layer 710. The substrate 100, the thin orienting film 200, the lower single crystal layer 300, and the upper single crystal layer 400 may be substantially the same as those described with reference to FIG. 1. The mask pattern 600 may be substantially the same as that described with reference to FIG. 5. The lower heat diffusion layer 710 may be substantially the same as that described with reference to FIG. 6.

According to example embodiments, the mask pattern 600 may reduce stress of the lower and upper single crystal layers 300 and 400. Therefore, the crystallinity of the lower and upper single crystal layers 300 and 400 may be improved.

According to example embodiments, the lower heat diffusion layer 710 may maintain the single crystal semiconductor structure 14 at a uniform temperature. Therefore, deterioration of the single crystal semiconductor structure 14 may be reduced or prevented.

Figure 9:
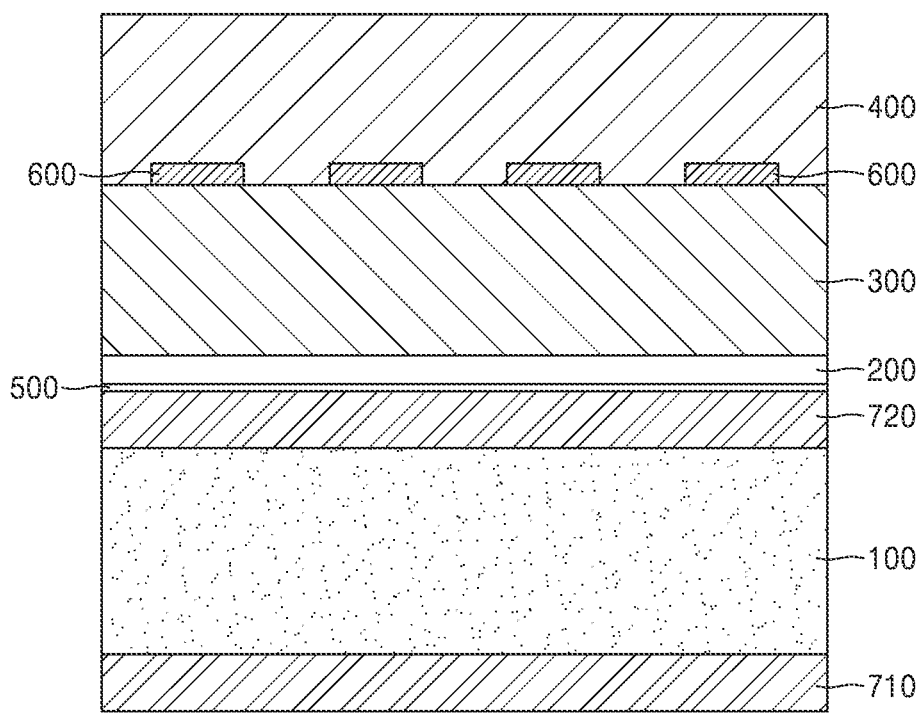
FIG. 9 is a cross-sectional view illustrating a single crystal semiconductor structure according to example embodiments.

FIG. 9 is a cross-sectional view illustrating a single crystal semiconductor structure 15 according to example embodiments. For clarity of illustration, substantially the same structures as those described with reference to FIGS. 1, 5, 6, and 7 may not be described here.

Referring to FIG. 9, the single crystal semiconductor structure 15 may be provided as follows. The single crystal semiconductor structure 15 may include a substrate 100, a thin orienting film 200, a lower single crystal layer 300, a mask pattern 600, an upper single crystal layer 400, a lower heat diffusion layer 710, an upper heat diffusion layer 720, and a planarization layer 500. The substrate 100, the thin orienting film 200, the lower single crystal layer 300, and the upper single crystal layer 400 may be substantially the same as those described with reference to FIG. 1. The mask pattern 600 may be substantially the same as that described with reference to FIG. 5. The lower heat diffusion layer 710 may be substantially the same as that described with reference to FIG. 6. The upper heat diffusion layer 720 and the planarization layer 500 may be substantially the same as those described with reference to FIG. 7.

According to example embodiments, the mask pattern 600 may reduce stress of the lower and upper single crystal layers 300 and 400. Therefore, the crystallinity of the lower and upper single crystal layers 300 and 400 may be improved.

According to example embodiments, the upper heat diffusion layer 720 and the lower heat diffusion layer 710 may maintain the single crystal semiconductor structure 15 at a uniform temperature. Therefore, deterioration of the single crystal semiconductor structure 15 may be reduced or prevented.

Figure 10:
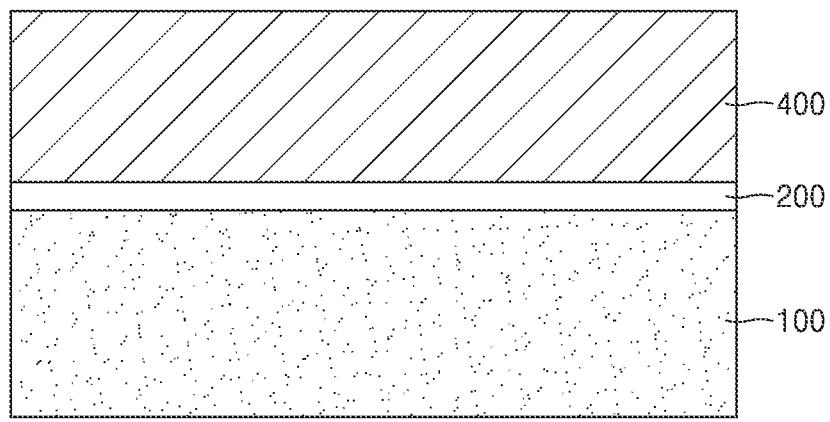
FIG. 10 is a cross-sectional view illustrating a single crystal semiconductor structure according to example embodiments.

FIG. 10 is a cross-sectional view illustrating a single crystal semiconductor structure 16 according to example embodiments. For clarity of illustration, substantially the same structures as those described with reference to FIG. 1 may not be described here.

Referring to FIG. 10, the single crystal semiconductor structure 16 may be provided as follows. The single crystal semiconductor structure 16 may include a substrate 100, a thin orienting film 200, and an upper single crystal layer 400. The substrate 100 and the upper single crystal layer 400 may be substantially the same as those described with reference to FIG. 1.

Referring to FIG. 10, unlike in the single crystal semiconductor structure 10 described with reference to FIG. 1, the upper single crystal layer 400 may be immediately (or directly) formed on the thin orienting film 200 without any lower single crystal layer provided therebetween. A defect may be formed on a top surface of the thin orienting film 200 before the upper single crystal layer 400 is formed. Because the thin orienting film 200 has a defect on the top surface thereof, the upper single crystal layer 400 may be directly formed on the thin orienting film 200 without a nucleation layer therebetween. Such a defect may be formed by performing a plasma surface treatment process on the top surface of the thin orienting film 200. The upper single crystal layer 400 may be formed through an epitaxy growth process performed at a relatively high temperature, for example, about 900 degrees (° C.) or higher. For example, the epitaxy growth process may be performed at about 1040 degrees (° C.). The process of forming the upper single crystal layer 400 may be substantially the same as that described with reference to FIGS. 1 and 2.

When the upper single crystal layer 400 is not stably provided on the thin orienting film 200, strain engineering films are required to reduce strain caused by a lattice constant difference between the upper single crystal layer 400 and the thin orienting film 200.

However, according to example embodiments, the thin orienting film 200 may have a sufficiently small thickness such that the upper single crystal layer 400 may be stably provided on the thin orienting film 200. Therefore, the upper single crystal layer 400 may be provided on the thin orienting film 200 in direct contact with the thin orienting film 200. In other words, films for reducing strain caused by a lattice constant difference may not be required between the thin orienting film 200 and the upper single crystal layer 400.

As described above, example embodiments may provide single crystal semiconductor structures including a single crystal semiconductor layer formed on an amorphous substrate.

In addition, example embodiments may provide methods of forming a single crystal semiconductor layer on an amorphous substrate.

However, effects of example embodiments are not limited thereto.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A single crystal semiconductor structure comprising:
an amorphous substrate;
a single crystal semiconductor layer provided on the amorphous substrate; and
an orienting film provided between the amorphous substrate and the single crystal semiconductor layer,
wherein the orienting film comprises a single crystal film,
wherein the orienting film has a non-zero thickness that is equal to or less than 10 times a critical thickness $h_c$, and
wherein the critical thickness $h_c$ is determined by the following equation:

$$h_c = \left[\frac{b}{4\pi(1+\mu)\epsilon_0}\right]\left[\ln\left(\frac{h_c}{b}\right)+1\right],$$

where b is a Burgers vector of dislocation of the orienting film, μ is Poisson's ratio of the orienting film, and $\epsilon_0$ is a degree of lattice misfit between the orienting film and the single crystal semiconductor layer, and wherein the orienting film has a (001) crystal orientation direction or a (111) crystal orientation direction and the single crystal semiconductor layer comprises a GaN layer having a (001) crystal orientation direction.

2. The single crystal semiconductor structure of claim 1, wherein the single crystal semiconductor layer comprises:
a lower single crystal layer; and
an upper single crystal layer, and
wherein the lower single crystal layer comprises a nucleation layer for the upper single crystal layer.

3. The single crystal semiconductor structure of claim 2, wherein a crystallinity of the upper single crystal layer is higher than a crystallinity of the lower single crystal layer.

4. The single crystal semiconductor structure of claim 2, further comprising:
a mask pattern provided between the lower single crystal layer and the upper single crystal layer,
wherein the mask pattern comprises holes through which the lower single crystal layer is exposed to the upper single crystal layer, and
wherein the upper single crystal layer is provided on the mask pattern and fills the holes.

5. The single crystal semiconductor structure of claim 2, wherein the orienting film has a lattice structure that matches a lattice structure of the lower single crystal layer.

6. The single crystal semiconductor structure of claim 1, wherein the orienting film comprises a $CeO_2$ film having a (111) crystal orientation direction or a $Sc_2O_3$ film having a (111) crystal orientation direction.

7. The single crystal semiconductor structure of claim 1, further comprising: an upper heat transfer layer provided between the orienting film and the amorphous substrate.

8. The single crystal semiconductor structure of claim 7, wherein the upper heat transfer layer comprises a metal.

9. The single crystal semiconductor structure of claim 7, further comprising: a planarization layer provided between the upper heat transfer layer and the orienting film,
wherein the planarization layer has a top surface facing the orienting film and a bottom surface facing the upper heat transfer layer, and
wherein a surface roughness of the top surface of the planarization layer is less than a surface roughness of the bottom surface of the planarization layer.

10. The single crystal semiconductor structure of claim 9, wherein the planarization layer comprises a silicon oxide or a silicon nitride.

11. The single crystal semiconductor structure of claim 7, further comprising: a lower heat transfer layer provided on a side of the amorphous substrate opposite the orienting film.

12. The single crystal semiconductor structure of claim 11, wherein the lower heat transfer layer comprises a metal.

13. A single crystal semiconductor structure comprising:
an amorphous substrate;
a single crystal semiconductor layer provided on the amorphous substrate; and
an orienting film provided between the amorphous substrate and the single crystal semiconductor layer,
wherein the orienting film comprises a single crystal film,
wherein the orienting film has a non-zero thickness that is equal to or less than 10 times a critical thickness $h_c$, and
wherein the critical thickness $h_c$ is determined by the following equation:

$$h_c = \left[\frac{b}{4\pi(1+\mu)\epsilon_0}\right]\left[\ln\left(\frac{h_c}{b}\right)+1\right],$$

where b is a Burgers vector of dislocation of the orienting film, $\mu$ is Poisson's ratio of the orienting film, and $\varepsilon_0$ is a degree of lattice misfit between the orienting film and the single crystal semiconductor layer, and wherein the orienting film comprises a MgO film having a (100) crystal orientation direction, and the single crystal semiconductor layer comprises a GaAs layer having a (100) crystal orientation direction.

\* \* \* \* \*